(12) United States Patent
Kajita

(10) Patent No.: US 7,768,303 B2
(45) Date of Patent: Aug. 3, 2010

(54) APPARATUS, CIRCUIT AND METHOD OF MONITORING PERFORMANCE

(75) Inventor: Mikihiro Kajita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/292,138

(22) Filed: Nov. 12, 2008

(65) Prior Publication Data
US 2009/0167360 A1 Jul. 2, 2009

(30) Foreign Application Priority Data
Dec. 27, 2007 (JP) ............................. 2007-337737

(51) Int. Cl.
H03K 19/173 (2006.01)
(52) U.S. Cl. .......................................... 326/46; 327/33
(58) Field of Classification Search .................. 326/46, 326/40, 52; 327/33, 199
See application file for complete search history.

(56) References Cited

U.S. PATENT DOCUMENTS

2005/0057314 A1* 3/2005 Hsu et al. ...................... 331/25

FOREIGN PATENT DOCUMENTS

JP 61-41976 2/1986
JP 8-16546 1/1996

OTHER PUBLICATIONS

James Tschanz, et al., "Adaptive Frequency and Biasing Techniques for Tolerance to Dynamic Temperature and Aging," ISSCC Dig. Tech. Papers, Feb. 2007.
Alan Drake, et al. "A Distributed Critical-Path Timing Monitor for a 65nm High Performance Microprocessor," ISSCC Dig. Tech. Papers, Feb. 2007.

* cited by examiner

Primary Examiner—Daniel D Chang
(74) Attorney, Agent, or Firm—McGinn IP Law Group, PLLC

(57) ABSTRACT

An apparatus includes a first sequential circuit which captures an input signal according to a first clock signal, a second sequential circuit which captures the input signal according to a second clock signal and outputs the captured input signal to a logic circuit, the second clock signal being modulated so that a period of the second clock signal is shorter than that of the first clock signal, a third sequential circuit which captures an output signal of the logic circuit according to the second clock signal, and a verification circuit which verifies whether an output signal of the first sequential circuit and an output signal of the third sequential circuit match with each other.

13 Claims, 10 Drawing Sheets

Fig. 3

|  | OUTPUT | | | |
|---|---|---|---|---|
| Mod 1 | H | L | L | L |
| Mod 2 | H | H | L | L |
| Mod 3 | J | H | H | L |
| POWER SUPPLY VOLTAGE EXAMPLE | 1.0V | 0.95V | 0.9V | 0.85V |

APPARATUS, CIRCUIT AND METHOD OF MONITORING PERFORMANCE

INCORPORATION BY REFERENCE

This application is based upon and claims the benefit of priority from Japanese patent application No. 2007-337737, filed on Dec. 27, 2007, the disclosure of which is incorporated herein in its entirety by reference.

BACKGROUND OF THE INVENTION

1. Field of the Invention

The present invention relates to a monitor circuit for a performance of an LSI (Large Scale Integrated Circuit).

2. Description of Related Art

Recently, a demand for a reduction in power consumption of a processor has been increasing more than ever. An increase in power consumption causes a rise of a temperature of an LSI, and has a negative influence on reliability of the processor such as a service lifetime thereof. In addition, the increase in power consumption may cause other problems. For example, because of the increased power consumption, the power consumption may reach close to the limit of a power supply system.

As a technique for reducing the power consumption of the processor, a clock gating or a data gating is known. These techniques may be implemented within the processor. The clock gating or the data gating stops or slows down the operation of unnecessary logic circuits. However, because of an increase in CLK frequency or in the number of processor cores in the processor for further performance improvement, it may become more difficult to reduce the power consumption with the clock gating or the data gating.

In this respect, dynamic voltage frequency scaling (DVFS) disclosed in Non-Patent Document 1 or the like has been proposed in recent years. In DVFS, a power drop or a temperature change is monitored, and a power supply voltage and an operating frequency are controlled. Thereby, the operation of the processor is dynamically and flexibly changed so that the monitored amount cannot become an amount that influences reliability or reaches the limit of the power supply capacity. In this way, the power consumption is controlled below a critical value in DVFS (an example of a circuit diagram is shown in FIG. 8).

In addition, Non-Patent Document 2 discloses a technique of controlling a system in accordance with a performance of the system by installing a performance monitor. The system to be monitored includes a delay margin. This performance monitor is configured to monitor whether data may be accurately acquired in flip-flops (FF) within the delay margin (an example of a circuit diagram is shown in FIG. 9). In addition, as a monitor used in general, a ring oscillator circuit as shown in Patent Document 1, for example, is known (an example of a circuit diagram is shown in FIG. 10).

[Non-Patent Document 1] James Tschanz, Nam Sung Kim, Saurabh Dighe, et. al., "Adaptive Frequency and Biasing Techniques for Tolerance to Dynamic Temperature and Aging," ISSCC Dig. Tech. Papers, February, 2007.

[Non-Patent Document 2] Alan Drake, Robert Stranger, Harmander Deogun, et. al., "A Distributed Critical-Path Timing Monitor for a 65 nm High Performance Microprocessor," ISSCC Dig. Tech. Papers, February, 2007.

[Patent Document 1] Japanese Patent Application Publication No. 61-041976

SUMMARY OF THE INVENTION

According to one exemplary aspect of the present invention, an apparatus includes a first sequential circuit which captures an input signal according to a first clock signal, a second sequential circuit which captures the input signal according to a second clock signal and outputs the captured input signal to a logic circuit, the second clock signal being modulated so that a period of the second clock signal is shorter than that of the first clock signal, a third sequential circuit which captures an output signal of the logic circuit according to the second clock signal, and a verification circuit which verifies whether an output signal of the first sequential circuit and an output signal of the third sequential circuit match with each other.

According to another exemplary aspect of the present invention, an apparatus includes a first sequential circuit which captures an input signal according to a first clock signal and outputs the captured input signal to a first logic circuit, a second sequential circuit which captures an output signal of the first logic circuit according to the first clock signal, a third circuit which captures the input signal according to a second clock signal and outputs the captured input signal to a second logic circuit, the second clock signal being modulated so that a period of the second clock signal is shorter than that of the first clock signal, a fourth circuit which captures an output signal of the second logic circuit according to the second clock signal, a verification circuit which verifies whether an output signal of the second sequential circuit and an output signal of the fourth sequential circuit match with each other.

According to another exemplary aspect of the present invention, a circuit includes a first sequential circuit which captures an input signal according to a first clock signal, a second sequential circuit which captures the input signal according to a second clock signal and outputs the captured input signal to a logic circuit, the second clock signal being modulated so that a period of the second clock signal is shorter than that of the first clock signal, a third sequential circuit which captures an output signal of the logic circuit according to the second clock signal, and a verification circuit which verifies whether an output signal of the first sequential circuit and an output signal of the third sequential circuit match with each other.

According to another exemplary aspect of the present invention, a method includes capturing an input signal according to a first clock signal, capturing the input signal according to a second clock signal, the second clock signal being modulated so that a period of the second clock signal is shorter than that of the first clock signal, outputting the captured input signal to a logic circuit, capturing an output signal of the logic circuit according to the second clock circuit, and verifying whether the captured input signal according to the first clock signal and the captured output signal of the logic circuit match with each other.

BRIEF DESCRIPTION OF THE DRAWINGS

Other exemplary aspects and advantages of the invention will be made more apparent by the following detailed description and the accompanying drawings, wherein:

FIG. 3 shows an example of a table showing power supply voltages corresponding to outputs of respective CLK signal patterns according to the first exemplary embodiment;

DETAILED DESCRIPTION OF THE EXEMPLARY EMBODIMENTS

Figure 8:
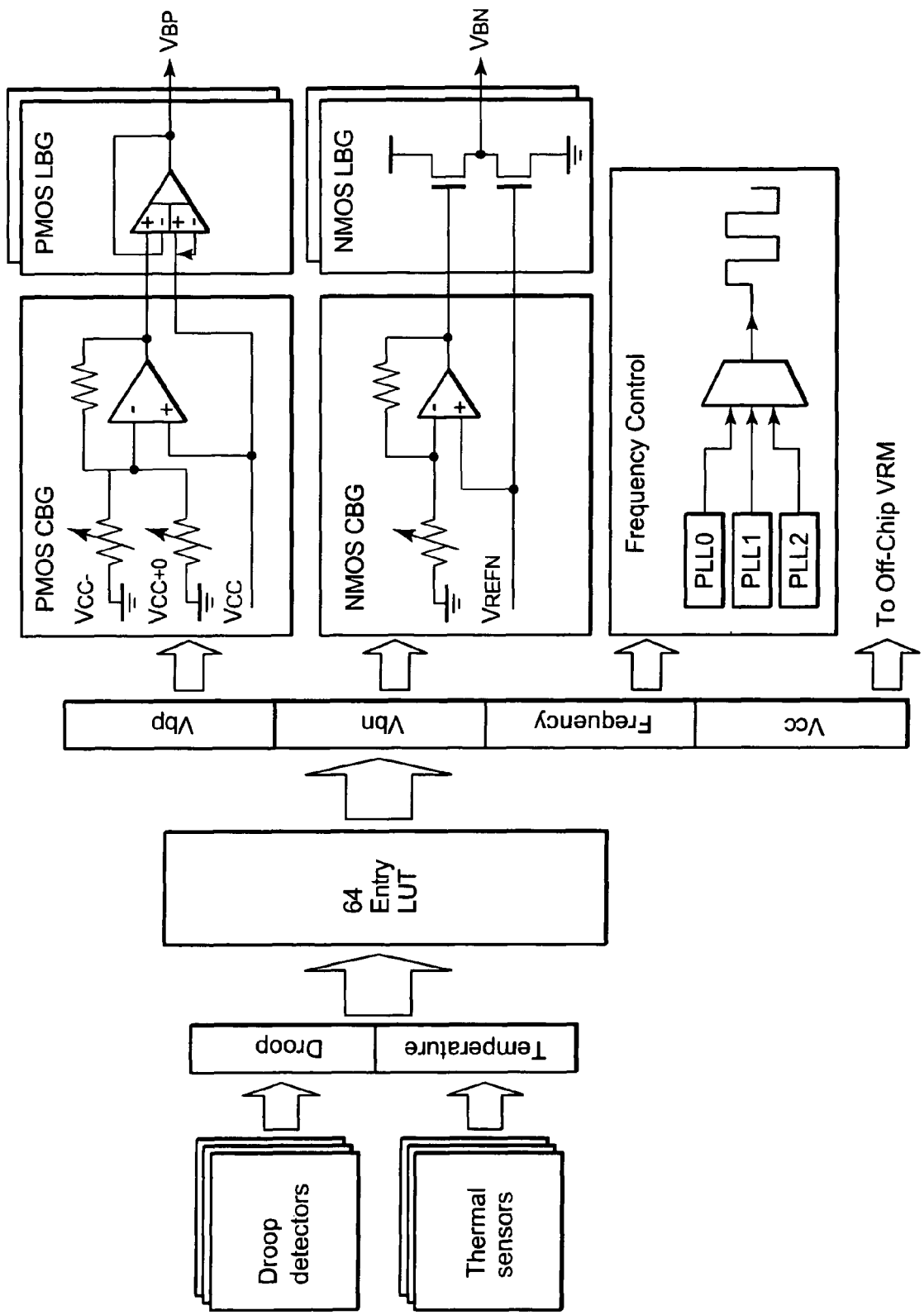
FIG. 8 is a diagram for describing a related art.
Figure 9:
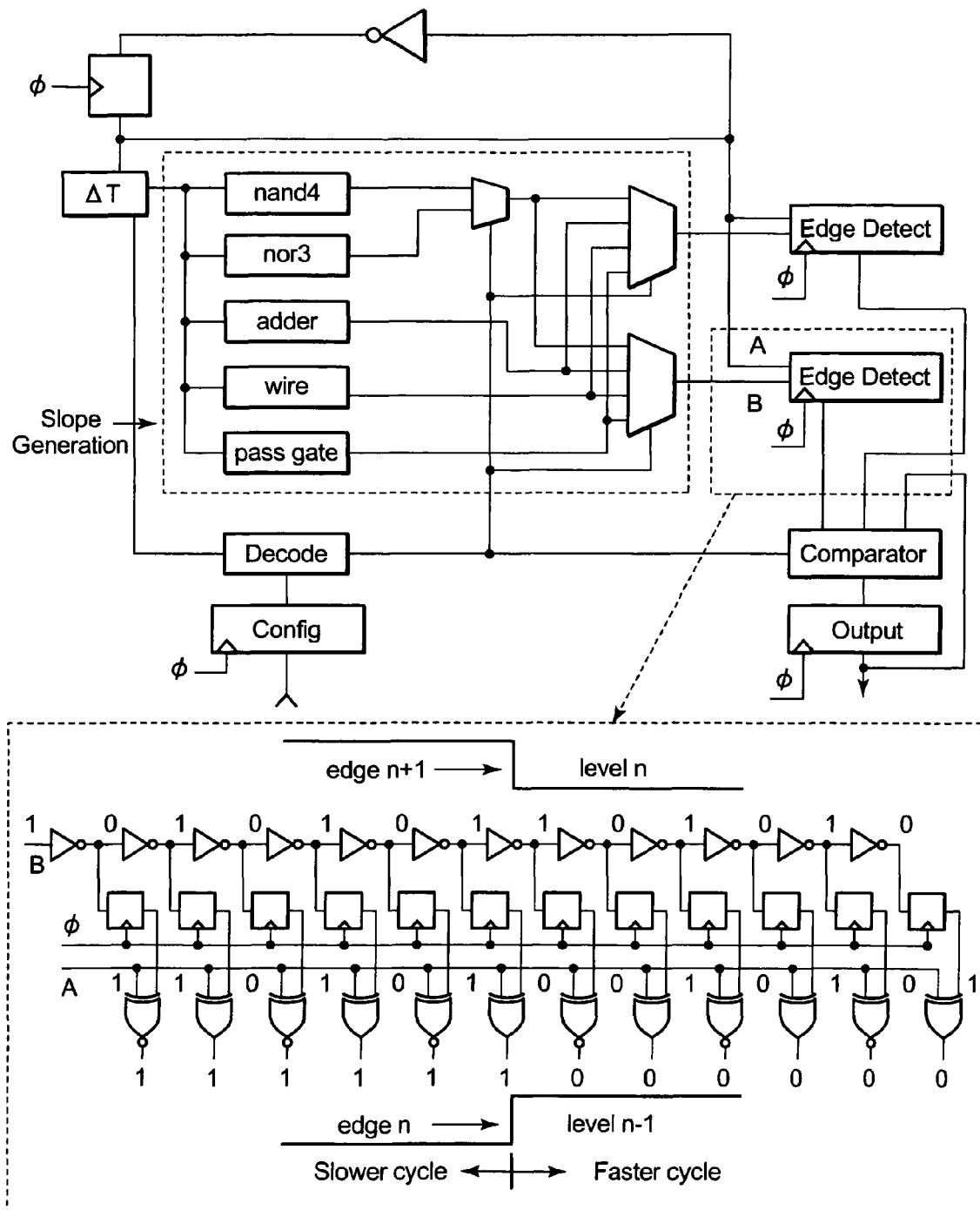
FIG. 9 is a diagram for describing another related art.
Figure 10:
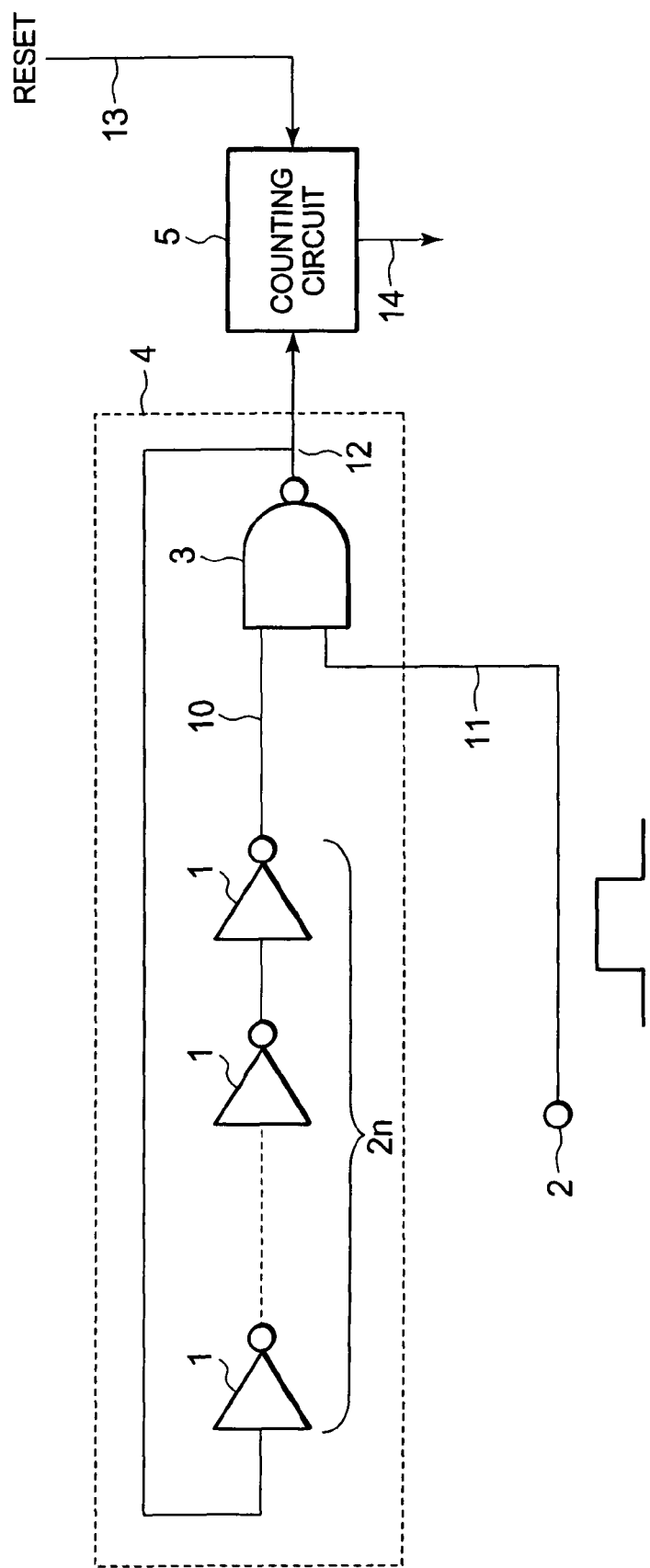
FIG. 10 is a diagram for describing yet another related art.

However, in any of these power reduction techniques described above referring to FIGS. 8 to 10, it is difficult to monitor a performance of an LSI during an LSI test. And, it is difficult to control a power consumption for reducing the power consumption. In addition, it is difficult to perform monitoring simply with a small circuit area.

In the present invention, the performance of the LSI may be monitored during the LSI test. The monitoring may be performed with a circuit having a small circuit area. And, with the circuit for monitoring the performance, the power consumption may be controlled for reducing the power consumption of the LSI.

A monitor circuit according to the present invention monitors a delay margin for each of the LSIs constituting a chip or each logic unit in the LSI. In order to monitor a delay margin for each of the LSIs or each of the logic unit(s) in the LSI as a chip performance, a clock signal provided to a flip-flop circuit is modulated to adjust a rising edge of the clock signal. In other words, the rising edge of the clock signal may be optionally adjustable in the present invention. Additionally, in the present invention, a power voltage of the chip and a frequency of the clock signal may be controlled for reducing the power consumption by using the monitor circuit.

1. First Exemplary Embodiment

Figure 1:
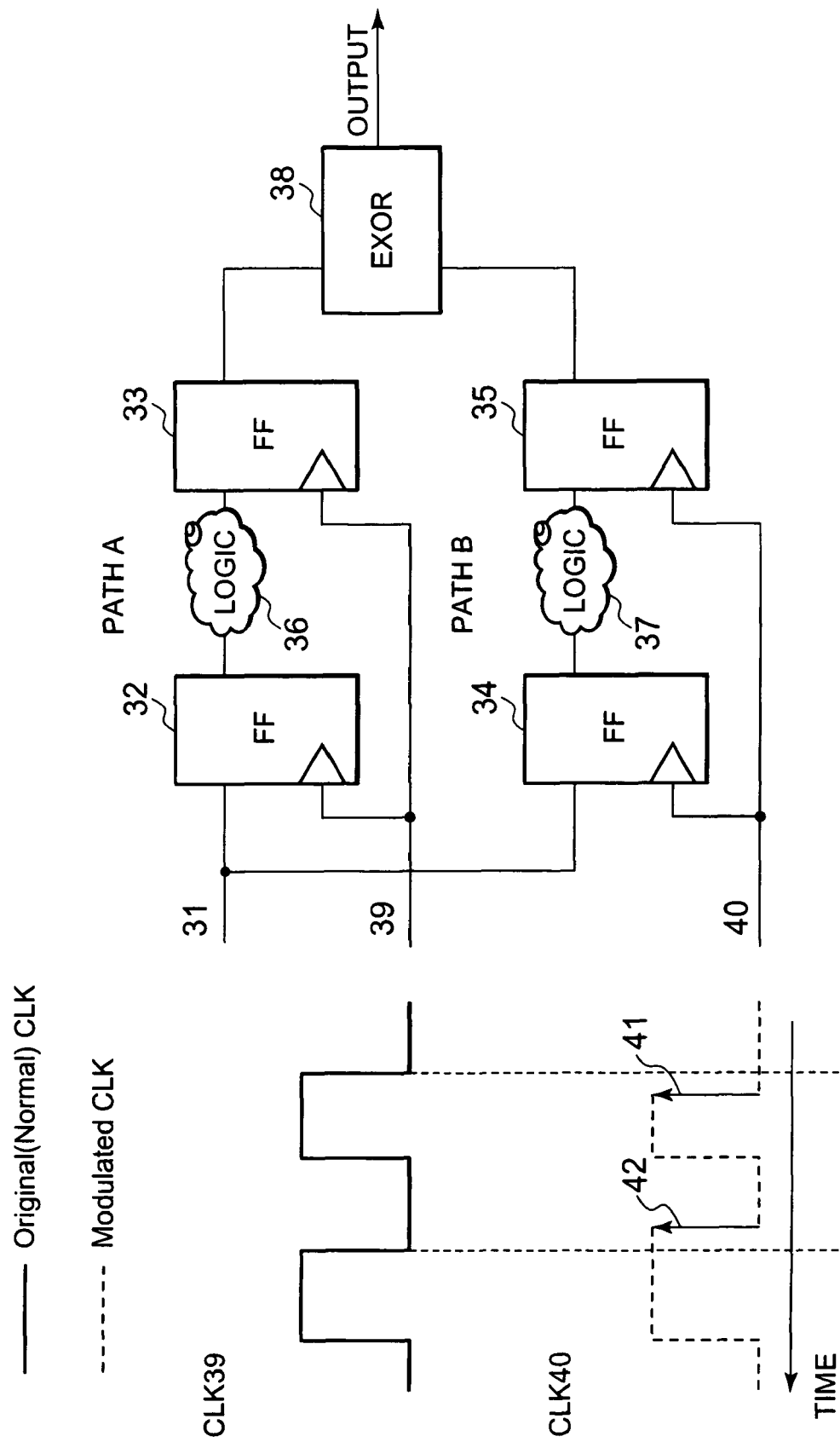
FIG. 1 is an exemplary monitor circuit of a first exemplary embodiment according to the present invention.

FIG. 1 is an exemplary circuit diagram of a monitor circuit according to the present invention. The monitor circuit includes a first logical path (logical path A) that operates according to a first clock signal, and a second logical path (logical path B) that operates according to a second clock signal. The logical path A and the logical path B respectively include flip-flop circuits 32 and 34 each of which acquires an input signal, logic circuits 36 and 37 respectively receiving output signals of the flip-flop circuits 32 and 34, and flip-flop circuits 33 and 35 respectively acquiring output signals of the logic circuits 36 and 37. Here, the first clock signal 39 may be a normal clock for operating the chip. The second clock signal 40 may be a clock signal in which the rising edge position of the clock signal is adjusted.

The monitor circuit determines a performance (e.g., the delay margin) of the chip on the basis of the adjusted rising edge position of the second clock and the rising edge position of the first clock, obtained when an output signal of logical path A and an output signal of logical path B do not match with each other.

A data 31 is inputted to the flip-flop circuit 32 (FF) and the flip-flop circuit 34 (FF). As to the FF 32, the inputted data 31 is captured by the FF 32 according to a rising edge of the first clock signal 39, and then the inputted data 31 is transmitted to the logic circuit 36. Then, the data 31 is transmitted to the FF 33 after passing through the logic circuit 36. The data 31 is captured by the FF 33 according to a next rising edge of the first clock signal 39 and then the data 31 is transmitted to an exclusive-OR circuit (EXOR) 38. This path is called path A.

On the other hand, as to the FF 34, the inputted data 31 is captured by the FF 34 according to a rising edge 41 of the second clock signal 40, and then the inputted data 31 is transmitted to the logic circuit 37. The data 31 is transmitted to the FF 35 after passing through the logic circuit 37. The data 31 is captured according to a rising edge 42 of the second clock signal 40, and then is transmitted to the EXOR 38. This path is called path B.

As shown in FIG. 1, the first clock signal 39 is a normal clock. The normal clock is a clock whose interval between the rising edges coincides with the CLK cycle. In addition, the second clock signal 40 is a clock including a waveform in which the rising edge of the normal clock (the first clock signal 39) is controlled. The specification of the second clock signal 40 will be described later in detail.

As to paths A and B, an assumption is made that the logic circuits thereof (36 and 37) are combination circuits having a same configuration, and that the amounts of delay that occur when the signal passes through each of the logic circuits are the same. The amount of delay is assumed to be less than the cycle of the first clock signal 39. It is noted that an even better effect may be obtained when the logic circuit is configured of a device configured of a critical path (such as an inverter, NAND or NOR) since the sensitivity for the power supply voltage becomes the same as that of the critical path.

The EXOR 38 detects whether or not the logical values of the data signals having passed through paths A and B coincide with each other. In a case where the logical values of these paths do not coincide with each other, the EXOR 38 outputs a High signal (e.g., the EXOR 38 outputs "1").

Figure 2:
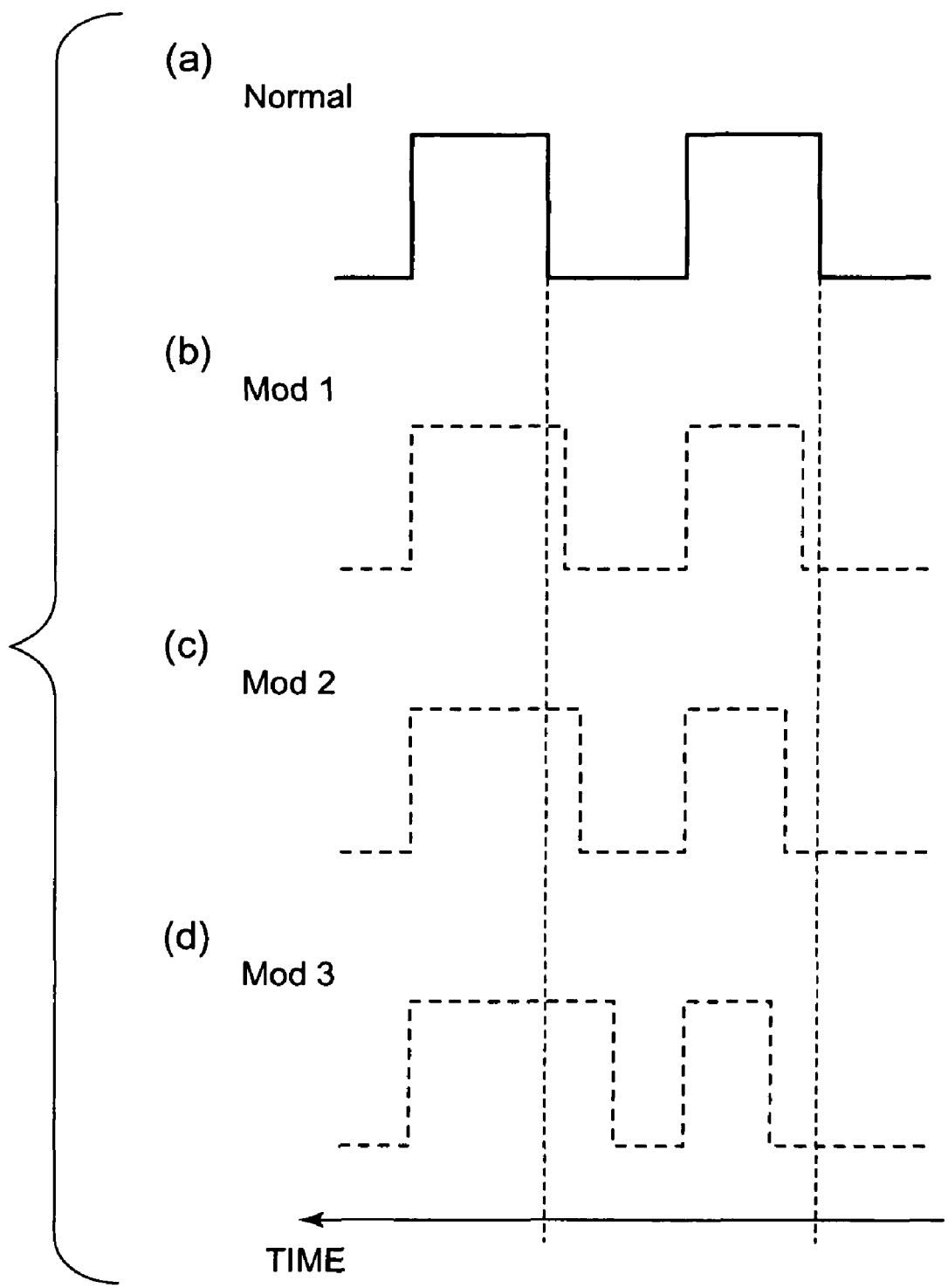
FIG. 2 is an exemplary diagram showing a CLK signal according to the first exemplary embodiment.

In FIG. 2, "Normal" shows a waveform of a normal clock signal. The second clock signal 40 is generated by controlling and modulating the rising edge position of the first clock signal shown in the "Normal" waveform of FIG. 2. For example, the rising edges of the second clock signal 40 may be adjusted so that the rising edge corresponding to the FF 34 shown in FIG. 1 becomes at a later position than the rising edge of the first clock signal 39, and the rising edge corresponding to the FF 35 becomes at an earlier position than the rising edge position of the first clock signal 39.

Since the amount of delay between FFs is the same, when the rising edge 41 for capturing the data 31 by the FF 34 is later than the corresponding rising edge of the first clock signal 39 and the rising edge 42 for capturing the data 31 by the FF 35 is earlier than the corresponding rising edge of the first clock signal 39, a condition becomes stricter with respect to the delay margin. In this respect, as shown in FIG. 2, multiple patterns of the clock signal (Mod1 to Mod3 in the drawings) are generated. For example, the patterns are adjusted in a manner that the condition of the rising edge position gradually becomes stricter. In other words, "Mod 1" is stricter than "Mod 2", and "Mod 3" is stricter than the "Mod 2". Among these multiple patterns ("Mod 1", "Mod 2" or "Mod 3"), it is determined which pattern causes a late arrival of the inputted data 31 at the FF 35 later than the multiple pattern by observing the output value of the EXOR 38. Thus, an amount of the delay margin for the delay path B may be measured.

FIG. 3 is an example of a table showing power supply voltage values corresponding to the outputs of the EXOR 38. In FIG. 3, the delay margin of the delay path is detected depending on which of the multiple patterns ("Mod1", "Mod2" or "Mod3") causes an inconsistency with the path A. Then, the power supply voltage may be defined based on the table shown in FIG. 3 in accordance with the detected delay margin. The path A may be a path used as a reference and is designed in order that data may be acquired accurately. In other words, the data may be acquired by the FF 33 within the delay margin.

For example, in a case where an inconsistency occurs in every pattern (specifically, in a case where the output is "High" in all of the Mod1 to Mod3), this means that the delay margin scarcely exists and that the path A is close to the critical path. Accordingly, the power supply voltage may be set to 1.0V, which is a normal condition, for example. On the other hand, in a case where an inconsistency does not occur in any of the patterns (specifically, in a case where the output is "Low" in all of the Mod1 to the Mod3), this means that a considerable amount of the delay margin exists. Accordingly, the power supply voltage may be set to 0.85V, for example, and power reduction is prioritized over the delay margin. Although the delay margin of the delay path becomes small as the power supply voltage decreases, no particular problem occurs if data transmission is normally performed with the decreased power supply voltage.

In addition, the power supply voltage may be adjusted in a more detailed manner by observing the output signal of the EXOR 38 for each of the delay paths and observing the rising edge position until the EXOR 38 outputs the High signal, rather than by separately generating the multiple patterns for the second clock signal 40. In the case of adjusting the power supply voltage in this manner, a control signal is preferably added in order that the rising edge position may be controlled.

Figure 4:
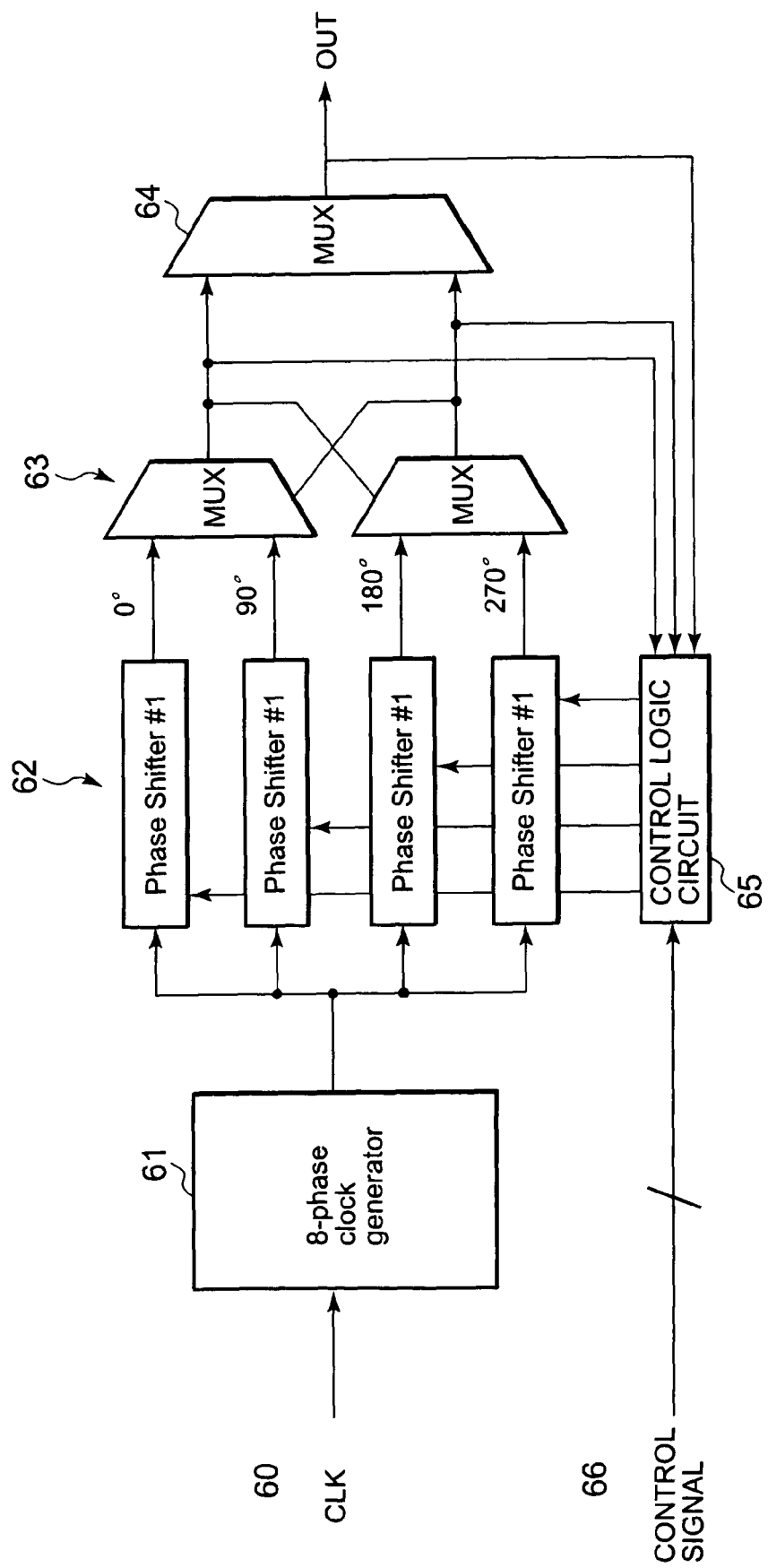
FIG. 4 shows an example of a circuit diagram that controls a rising edge of a clock signal according to the first exemplary embodiment.

FIG. 4 shows an exemplary configuration of a modulation circuit 600 which modulates the first clock signal 39 to generate the second clock signal 40. A normal clock (CLK 60), (i.e., the first clock signal 39) is inputted to an 8-phase clock generator 61. CLK signals whose phases are shifted by n/4 each are outputted from the 8-phase clock generator 61. Each of phase shift circuits (phase shifters 62) is capable of shifting each of the inputted signals of the phases by a predetermined amount of delay. A control logic circuit 65 defines the predetermined amount of delay for each signal. The phase shifters 62 input the signals shifted by the predetermined amounts of delay to MUX circuits 63. Each of the MUX circuits 63 extracts and outputs a signal of a desired edge.

Figure 5:
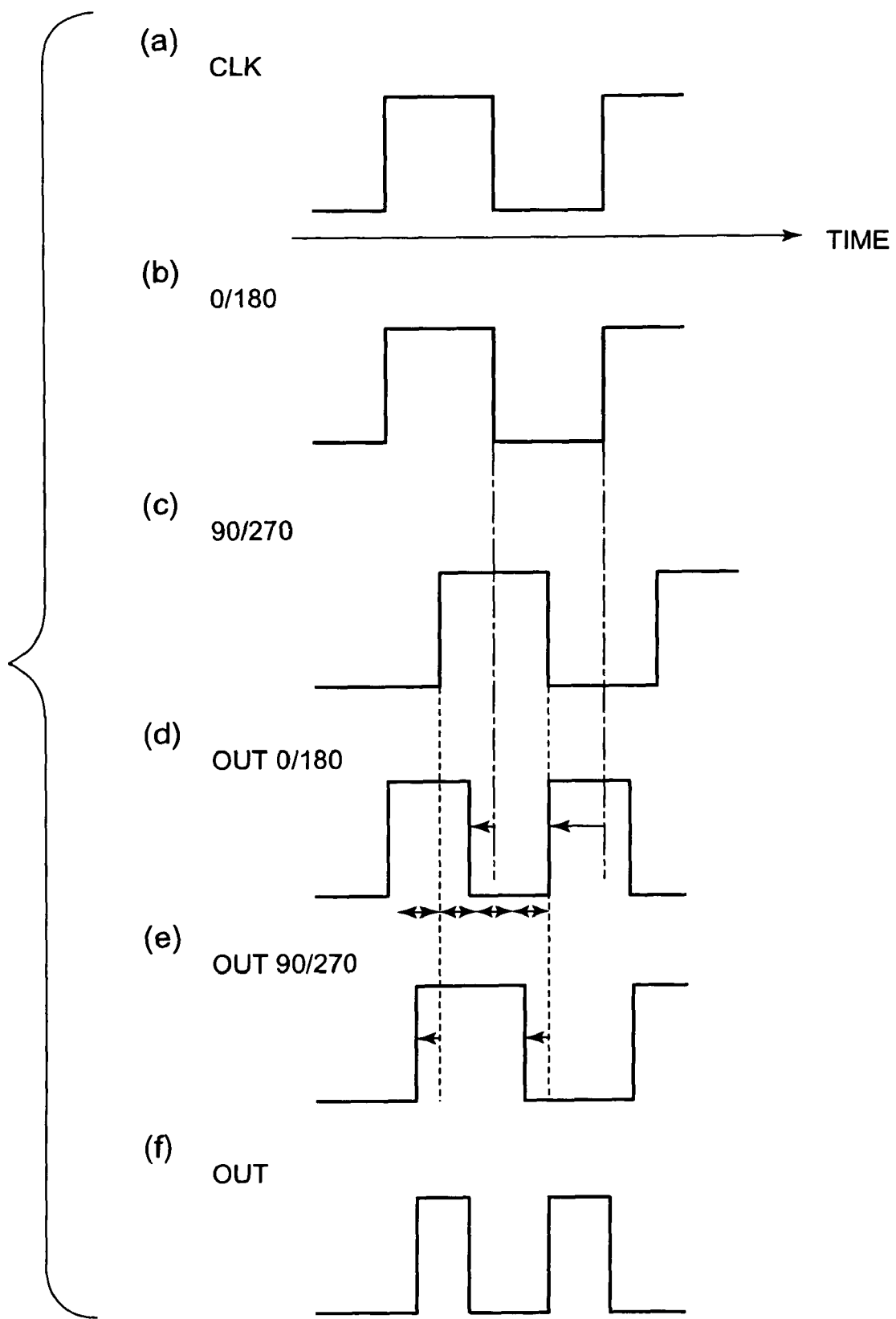
FIG. 5 is diagram for describing a state of how a waveform of a clock signal according to the first exemplary embodiment is generated.

FIG. 5 shows exemplary diagrams for describing how the waveform of the "Mod 1" to "Mod 3" shown in FIG. 3 is generated. First, a signal CLK, which is shown as "CLK" in (a) of FIG. 5, is set to be a reference signal. A signal, which is shown as "0/180" in (b) of FIG. 5, shows a signal which includes a phase difference of 0° or 180° with respect to the signal CLK ("CLK" in (a) FIG. 5). A signal, which is shown as "90/270" in (c) of FIG. 5, shows a signal which includes a phase difference of 90° or 270° with respect to the signal CLK ("CLK" in (a) of FIG. 5).

Then, phase shifting is performed with respect to each of the phases which is shown as "0/180" or "90/270". The phase shifting is shown as "OUT 0/180" or "OUT 90/270" in (d) and (e) respectively of FIG. 5. Then, by combining these signals which are shown as "OUT 0/180" or "OUT 90/270", a waveform including a modified rising edge position is generated (shown as "OUT" in (f) of FIG. 5). The modulation circuit 600 is not limited to the circuit shown in FIG. 4, and another known circuit may be used.

Figure 6:
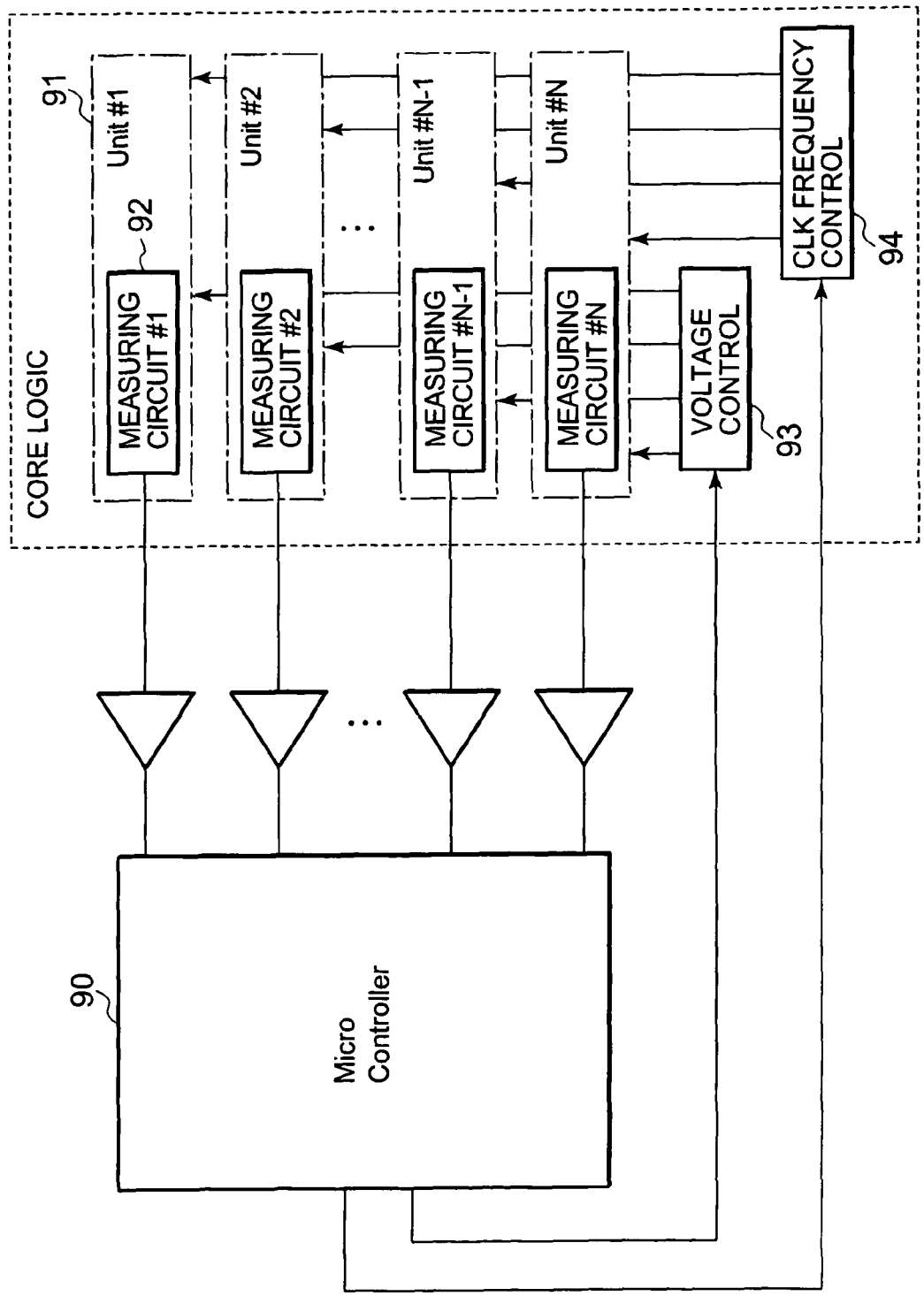
FIG. 6 shows a configuration example of a power reduction system according to the first exemplary embodiment.

The monitor circuit is provided preferably for each logic unit of the LSI, and optimum power supply voltage control is performed by using the power supply voltage which is determined in the aforementioned manner. FIG. 6 shows a configuration example of a power reduction system in which the monitor circuit is provided for each logic unit. A microcontroller 90 controls the voltage or the CLK frequency of the logic units 91 according to results of monitoring of the monitor circuits 92 (Unit #1 to #N). Then, the power value and the frequency of each of the logic units 91 is adjusted to the optimum value by a power supply voltage control circuit 93 and a CLK frequency control circuit 94.

The power value or the frequency of each of the logic units 91 may be adjusted dynamically while the chip operates as in FIG. 6, or may be adjusted by another technique. For example, the power value may be adjusted during an LSI testing, and the chip ID corresponding to the adjusted value is previously recorded in a fuse or the like. Then, the optimum voltage or CLK frequency may be applied for each of the chips or each of the logic units by reading the chip ID from the fuse and by setting the adjusted value corresponding to the chip ID when the chip is used in the system.

2. Second Exemplary Embodiment

Figure 7:
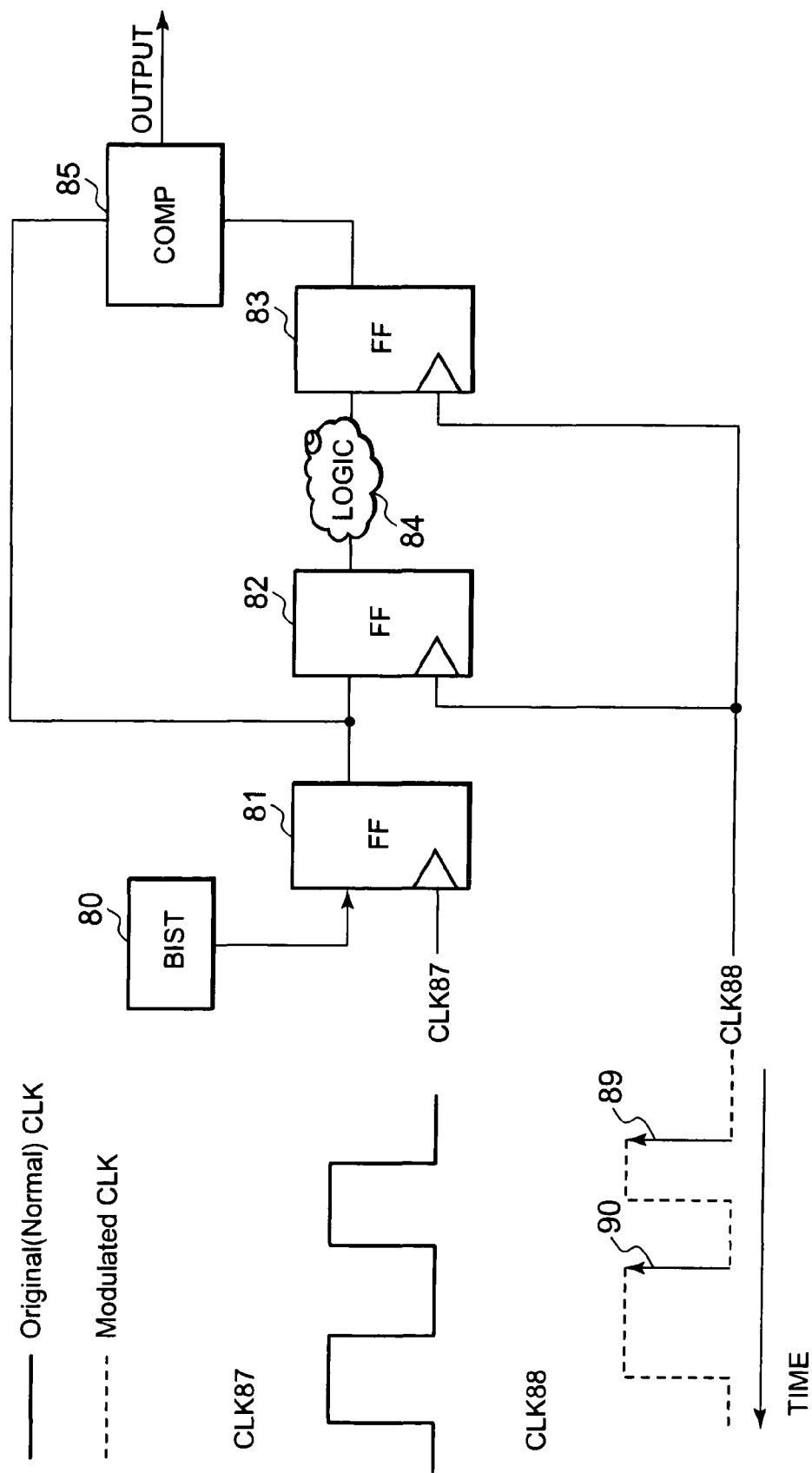
FIG. 7 is an exemplary circuit diagram showing a monitoring scheme of a monitor circuit according to a second exemplary embodiment according to the present invention.

FIG. 7 shows a second exemplary embodiment of the present invention. The monitor circuit according to the second exemplary embodiment includes a flip-flop circuit 81 acquiring an input signal according to the first clock signal, a flip-flop circuit 82 acquiring an output signal of the flip-flop circuit 81 according to the second signal, a logic circuit 84 receiving an output signal of the flip-flop circuit 82, and a flip-flop circuit 83 acquiring an output signal of the logic circuit 84 according to the second clock signal. The first clock signal 87 is a normal clock for operating a chip. The second clock signal 88 is a clock signal in which the rising edge position of the first clock signal 87 is adjusted. The monitor circuit determines a performance of the chip on the basis of the adjusted rising edge position of the second clock signal 88 and the rising edge position of the first clock signal 87, obtained when the output signal of the flip-flop circuit 81 and the output signal of the flip-flop circuit 83 form a predetermined combination.

A data pattern generated by a built-in self test (BIST) circuit 80 is used as an input to the FF 81. The BIST circuit 80 generates a data pattern and inputs the generated data pattern to the FF 81. The data pattern inputted to the FF 81 is captured by the FF 81 according to the first clock signal 87 and then is transmitted to the FF 82. The data transmitted from the FF 81 is captured by the FF82 according to a rising edge 89 of the second clock signal 88, and then is transmitted to a logic circuit 84. The data pattern is transmitted to the FF 83 after passing through the logic circuit 84, and is captured by the FF 83 according to a rising edge 90 next to the rising edge 89.

Then, the data pattern is transmitted to a comparison circuit 85. The comparison circuit 85 compares the accurate data pattern generated by the BIST circuit 80 with the data pattern transmitted after passing through the logic circuit 84. Then, if these test patterns match with each other, the comparison circuit 85 outputs a Low signal, and if these test patterns do not match with each other, the comparison circuit 85 outputs a High signal. The rising edges 89 and 90 are controlled and generated for observing the delay margin as described in the first exemplary embodiment. Accordingly, the same effect as that obtained in the first exemplary embodiment may be obtained in the second exemplary embodiment as well.

According to the monitor circuit of the present invention described above, an optimum resource (power supply voltage, clock frequency or the like) may be defined for each unit or chip. For this reason, according to the power reduction system using the monitor circuit, the delay margin conventionally treated as uncertain may be used for controlling the power consumption, and the power consumption of the chip may be reduced. In addition, since the circuit size of the monitor circuit is small, only a small installation area is required for the actual implementation. Accordingly, the optimum effect may be obtained by avoiding an increase in power caused by an increase in area or an additional circuit, or the like.

While the present invention has been described with reference to the accompanying drawings, it is to be understood that modifications will be apparent to those skilled in the art without departing from the spirit of the invention.

Further, it is noted that applicant's intent is to encompass equivalents of all claim elements, even if amended later during prosecution.

What is claimed is:

1. An apparatus, comprising:
   a first sequential circuit which captures an input signal according to a first clock signal;
   a second sequential circuit which captures the input signal according to a second clock signal and outputs the captured input signal to a logic circuit, the second clock signal being modulated so that a period of the second clock signal is shorter than that of the first clock signal;
   a third sequential circuit which captures an output signal of the logic circuit according to the second clock signal;
   a verification circuit which verifies whether an output signal of the first sequential circuit and an output signal of the third sequential circuit match with each other; and
   a controller which controls a parameter for operating the logic circuit based on a verification result of the verification circuit.

2. The apparatus according to claim 1, wherein the parameter includes a voltage level for operating the logic circuit.

3. The apparatus according to claim 1, wherein the parameter includes a frequency for operating the logic circuit.

4. The apparatus according to claim 1, wherein the second clock signal is modulated so that a first clock pulse corresponding to the second sequential circuit is later than the first clock signal, and a second clock pulse corresponding to the third sequential circuit is earlier than the first clock signal.

5. The apparatus according to claim 1, further comprising:
   a modulation circuit which generates a plurality of kinds of second clock signals,
   wherein the verification circuit verifies whether each of the output signals of the second sequential circuit according to each of the second clock signals matches the output signal of the first sequential circuit.

6. The apparatus according to claim 5,
   wherein the controller controls the parameter according to a number of times when each of the output signals of the second sequential circuit and the output signal of the first sequential circuit match with each other.

7. An apparatus, comprising:
   a first sequential circuit which captures an input signal according to a first clock signal and outputs the captured input signal to a first logic circuit;
   a second sequential circuit which captures an output signal of the first logic circuit according to the first clock signal;
   a third sequential circuit which captures the input signal according to a second clock signal and outputs the captured input signal to a second logic circuit, the second clock signal being modulated so that a period of the second clock signal is shorter than that of the first clock signal;
   a fourth sequential circuit which captures an output signal of the second logic circuit according to the second clock signal; and
   a verification circuit which verifies whether an output signal of the second sequential circuit and an output signal of the fourth sequential circuit match with each other.

8. A method, comprising:
   capturing an input signal according to a first clock signal;
   capturing the input signal according to a second clock signal, the second clock signal being modulated so that a period of the second clock signal is shorter than that of the first clock signal;
   outputting the captured input signal to a logic circuit;
   capturing an output signal of the logic circuit according to the second clock circuit;
   verifying whether the captured input signal according to the first clock signal and the captured output signal of the logic circuit match with each other; and
   controlling a parameter for operating the logic circuit based on the verifying.

9. The method according to claim 8, further comprising:
   controlling a voltage level for operating the logic circuit based on the verifying.

10. The method according to claim 8, further comprising:
    controlling a frequency for operating the logic circuit based on the verifying.

11. The method according to claim 8, further comprising:
    modulating the second clock signal so that a first clock pulse is later than the first clock signal and a second clock pulse is earlier than the first clock signal.

12. The method according to claim 8, further comprising:
    generating a plurality of kinds of second clock signals; and
    verifying whether each of the captured output signal of the logic circuit according to each of the second clock signals match the captured input signal according to the first clock signal.

13. The method according to claim 12, further comprising:
    controlling the parameter according to a number of times when the captured input signal according to the first clock signal and each of the captured output signal of the logic circuit according to each of the second clock signals match with each other.

* * * * *